United States Patent
Namuduri et al.

(10) Patent No.: US 9,777,660 B2
(45) Date of Patent: Oct. 3, 2017

(54) PARAMETER ESTIMATION IN AN ACTUATOR

(71) Applicant: GM GLOBAL TECHNOLOGY OPERATIONS LLC, Detroit, MI (US)

(72) Inventors: Chandra S. Namuduri, Troy, MI (US); Suresh Gopalakrishnan, Troy, MI (US); Thomas Wolfgang Nehl, Shelby Township, MI (US); Avoki M. Omekanda, Rochester, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 284 days.

(21) Appl. No.: 14/658,379

(22) Filed: Mar. 16, 2015

(65) Prior Publication Data

US 2015/0267664 A1   Sep. 24, 2015

Related U.S. Application Data (60) Provisional application No. 61/968,145, filed on Mar. 20, 2014, provisional application No. 61/968,048, filed on Mar. 20, 2014.

(51) Int. Cl.
*F02D 41/20* (2006.01)
*F02M 51/00* (2006.01)
(Continued)

(52) U.S. Cl.
CPC .......... *F02D 41/20* (2013.01); *F02M 51/005* (2013.01); *F02M 51/061* (2013.01); *G01K 13/00* (2013.01);
(Continued)

(58) Field of Classification Search
CPC .. F02D 41/14; F02D 41/20; F02D 2041/1423; F02D 2041/2024;
(Continued)

(56) References Cited

U.S. PATENT DOCUMENTS

| 5,381,297 A | 1/1995 | Weber |
| 5,831,809 A * | 11/1998 | Schmitz .............. F02D 13/0253 361/154 |

(Continued)

FOREIGN PATENT DOCUMENTS

| CN | 101514939 A | 8/2009 |
| CN | 101909955 A | 12/2010 |

(Continued)

OTHER PUBLICATIONS

A. M. Pawlak, Transient Finite Element Modeling of Solenoid Actuators, IEEE Transactions on Magnetics, Jan. 1988, 270-273, vol. 24, No. 1.

(Continued)

*Primary Examiner* — Ryan Reis (57) ABSTRACT

A method for parameter estimation in an electromagnetic actuator having an electrical coil and an armature includes applying a voltage pulse to the electrical coil of the actuator prior to an actuator event and of sufficient duration to ensure that a resulting electrical current achieves steady state. At least one parameter of the actuator is estimated based upon the voltage pulse and the steady state current.

14 Claims, 2 Drawing Sheets

(51) Int. Cl.
  *F02M 51/06* (2006.01)
  *G01K 13/00* (2006.01)
  *G01R 31/06* (2006.01)
  *H01F 7/18* (2006.01)
  *H01F 7/16* (2006.01)

(52) U.S. Cl.
  CPC ........... *G01R 31/06* (2013.01); *H01F 7/1844* (2013.01); *F02D 2041/2058* (2013.01); *F02D 2041/2065* (2013.01); *H01F 7/1638* (2013.01)

(58) Field of Classification Search
  CPC ..... F02D 2041/2044; F02D 2041/2058; F02D 2041/2062; F02D 2041/2065; F02M 51/005; F02M 51/061; F02M 51/0625; F02M 65/005
  See application file for complete search history.

(56) References Cited

U.S. PATENT DOCUMENTS

| | | | |
|---|---|---|---|
| 6,168,135 B1 | 1/2001 | Fochtman | |
| 6,321,700 B1* | 11/2001 | Hein | F01L 9/04 123/90.11 |
| 6,657,847 B1* | 12/2003 | Wright | F01L 9/04 361/152 |
| 2001/0043450 A1* | 11/2001 | Seale | F01L 9/04 361/160 |
| 2002/0148442 A1 | 10/2002 | Fraenkle | |
| 2003/0184946 A1* | 10/2003 | Kolmanovsky | F01L 9/04 361/160 |
| 2007/0056784 A1 | 3/2007 | Joe | |
| 2007/0120332 A1 | 5/2007 | Bushko | |
| 2007/0285195 A1* | 12/2007 | Nehl | G01R 33/14 335/209 |
| 2008/0204178 A1 | 8/2008 | Maranville | |
| 2010/0018503 A1 | 1/2010 | Perry | |
| 2011/0125391 A1 | 5/2011 | McAlister | |
| 2012/0018262 A1 | 1/2012 | Winkler | |
| 2012/0101707 A1 | 4/2012 | Kemmer | |
| 2012/0239278 A1 | 9/2012 | Becker | |
| 2012/0247428 A1 | 10/2012 | Grimminger | |
| 2012/0283883 A1* | 11/2012 | Wilms | F02D 41/2464 700/282 |
| 2013/0113407 A1 | 5/2013 | Neelakantan | |
| 2013/0133748 A1* | 5/2013 | Lehner | F02D 41/247 137/1 |
| 2014/0069533 A1 | 3/2014 | Gorzen | |
| 2014/0092516 A1* | 4/2014 | Koch | F02D 41/20 361/160 |
| 2014/0110508 A1* | 4/2014 | Dames | H01F 7/1646 239/585.1 |
| 2014/0117121 A1* | 5/2014 | Nong | F02M 51/061 239/584 |
| 2015/0123662 A1 | 5/2015 | Wastling et al. | |
| 2015/0267660 A1 | 9/2015 | Nehl | |
| 2015/0267661 A1 | 9/2015 | Namuduri | |
| 2015/0267662 A1 | 9/2015 | Nehl | |
| 2015/0267666 A1 | 9/2015 | Gopalakrishnan | |
| 2015/0267667 A1 | 9/2015 | Namuduri | |
| 2015/0267668 A1 | 9/2015 | Gopalakrishnan | |
| 2015/0267669 A1 | 9/2015 | Nehl | |
| 2015/0267670 A1 | 9/2015 | Nehl | |
| 2015/0285175 A1 | 10/2015 | Parrish | |

FOREIGN PATENT DOCUMENTS

| | | |
|---|---|---|
| CN | 103422979 A | 12/2013 |
| DE | 34 37 053 C2 | 6/1985 |
| DE | 196 43 788 A1 | 5/1998 |
| DE | 199 21 938 A1 | 12/1999 |
| DE | 10 2007 053 877 B3 | 4/2009 |
| DE | 10 2011 083 007 A1 | 3/2013 |
| DE | 10 2012 208 781 B4 | 11/2013 |
| EP | 0 074 420 A1 | 3/1983 |
| EP | 1670005 A2 | 6/2006 |
| EP | 2336544 A1 | 6/2011 |
| JP | 10-311265 A | 11/1998 |
| JP | 2007-270658 A | 10/2007 |
| KR | 10-2002-0094494 A | 12/2002 |
| WO | WO 87-01765 A1 | 3/1987 |
| WO | WO 90-02872 A1 | 3/1990 |
| WO | WO 2015 143107 A1 | 9/2015 |
| WO | WO 2015 143109 A1 | 9/2015 |
| WO | WO 2015 143116 A1 | 9/2015 |

OTHER PUBLICATIONS

T. W. Nehl, ANTIC85: A General Purpose Finite Element Package for Computer Aided Design, IEEE Transactions on Magnetics, Jan. 1988, 358-361, vol. 24, No. 1.

\* cited by examiner

PARAMETER ESTIMATION IN AN ACTUATOR

CROSS REFERENCE TO RELATED APPLICATIONS

This application claims the benefit of U.S. provisional Application No. 61/968,145, filed on Mar. 20, 2014, and U.S. provisional Application No. 61/968,048, filed on Mar. 20, 2014, both of which are incorporated by reference.

TECHNICAL FIELD

This disclosure is related to solenoid-activated actuators.

BACKGROUND

The statements in this section merely provide background information related to the present disclosure. Accordingly, such statements are not intended to constitute an admission of prior art.

Solenoid actuators can be used to control fluids (liquids and gases), or for positioning or for control functions. A typical example of a solenoid actuator is the fuel injector. Fuel injectors are used to inject pressurized fuel into a manifold, an intake port, or directly into a combustion chamber of internal combustion engines. Known fuel injectors include electromagnetically-activated solenoid devices that overcome mechanical springs to open a valve located at a tip of the injector to permit fuel flow therethrough. Injector driver circuits control flow of electric current to the electromagnetically-activated solenoid devices to open and close the injectors. Injector driver circuits may operate in a peak-and-hold control configuration or a saturated switch configuration.

Fuel injectors are calibrated, with a calibration including an injector activation signal including an injector open-time, or injection duration, and a corresponding metered or delivered injected fuel mass operating at a predetermined or known fuel pressure. Injector operation may be characterized in terms of injected fuel mass per fuel injection event in relation to injection duration. Injector characterization includes metered fuel flow over a range between high flowrate associated with high-speed, high-load engine operation and low flowrate associated with engine idle conditions.

It is known for engine control to benefit from injecting a plurality of small injected fuel masses in rapid succession. Generally, when a dwell time between consecutive injection events is less than a dwell time threshold, injected fuel masses of subsequent fuel injection events often result in a larger delivered magnitude than what is desired even through equal injection durations are utilized. Accordingly, such subsequent fuel injection events can become unstable resulting in unacceptable repeatability. Fuel injectors are often affected by the operating temperature at any given time. Knowledge of the instantaneous operating temperature of the fuel injector can therefore be useful for controlling fuel injection events of the fuel injector. It is known to correlate resistance of an electrical circuit to operating temperature. When activation of the fuel injector is controlled based upon electrical current applied to an electrical coil, it is difficult to estimate the resistance of the electrical coil due to resistance drops that occur in response to transitions in electrical current applied to the electrical coil.

SUMMARY

A method for parameter estimation in an electromagnetic actuator having an electrical coil and an armature includes applying a voltage pulse to the electrical coil of the actuator prior to an actuator event and of sufficient duration to ensure that a resulting electrical current achieves steady state. At least one parameter of the actuator is estimated based upon the voltage pulse and the steady state current.

BRIEF DESCRIPTION OF THE DRAWINGS

One or more embodiments will now be described, by way of example, with reference to the accompanying drawings, in which.

DETAILED DESCRIPTION

This disclosure describes the concepts of the presently claimed subject matter with respect to an exemplary application to linear motion fuel injectors. However, the claimed subject matter is more broadly applicable to any linear or non-linear electromagnetic actuator that employs an electrical coil for inducing a magnetic field within a magnetic core resulting in an attractive force acting upon a movable armature. Typical examples include fluid control solenoids, gasoline or diesel or CNG fuel injectors employed on internal combustion engines and non-fluid solenoid actuators for positioning and control.

Figure 1:
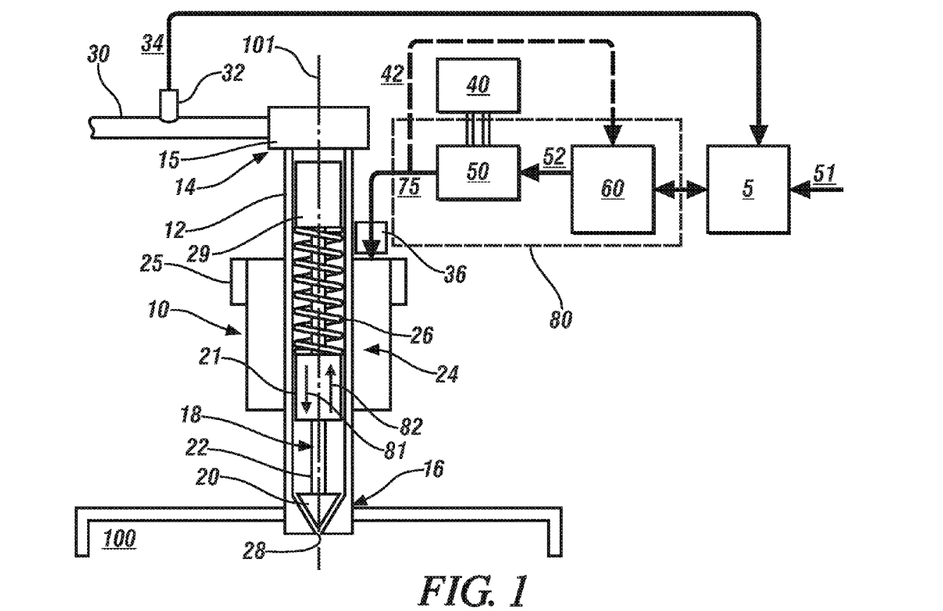
FIG. 1 illustrates a schematic sectional view of a fuel injector and an activation controller, in accordance with the present disclosure.

Referring now to the drawings, wherein the showings are for the purpose of illustrating certain exemplary embodiments only and not for the purpose of limiting the same, FIG. 1 schematically illustrates a non-limiting exemplary embodiment of an electromagnetically-activated direct-injection fuel injector 10. While an electromagnetically-activated direct-injection fuel injector is depicted in the illustrated embodiment, a port-injection fuel injector is equally applicable. The fuel injector 10 is configured to inject fuel directly into a combustion chamber 100 of an internal combustion engine. An activation controller 80 electrically operatively connects to the fuel injector 10 to control activation thereof. The activation controller 80 corresponds to only the fuel injector 10. In the illustrated embodiment, the activation controller 80 includes a control module 60 and an injector driver 50. The control module 60 electrically operatively connects to the injector driver 50 that electrically operatively connects to the fuel injector 10 to control activation thereof. The fuel injector 10, control module 60 and injector driver 50 may be any suitable devices that are configured to operate as described herein. In the illustrated embodiment, the control module 60 includes a processing device. In one embodiment, one or more components of the activation controller 80 are integrated within a connection assembly 36 of the fuel injector 36. In another embodiment, one or more components of the activation controller 80 are integrated within a body 12 of the fuel injector 10. In even yet another embodiment, one or more components of the activation controller 80 are external to—and in close proximity with—the fuel injector 10 and electrically operatively connected to the connection assembly 36 via one or more cables and/or wires. The terms "cable" and "wire" will be used interchangeably herein to provide transmission of electrical power and/or transmission of electrical signals.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 milliseconds during ongoing engine and vehicle operation. Alternatively, routines may be executed in response to occurrence of an event.

In general, an armature is controllable to one of an actuated position and a static or rest position. The fuel injector 10 may be any suitable discrete fuel injection device that is controllable to one of an open (actuated) position and a closed (static or rest) position. In one embodiment, the fuel injector 10 includes a cylindrically-shaped hollow body 12 defining a longitudinal axis 101. A fuel inlet 15 is located at a first end 14 of the body 12 and a fuel nozzle 28 is located at a second end 16 of the body 12. The fuel inlet 15 is fluidly coupled to a high-pressure fuel line 30 that fluidly couples to a high-pressure injection pump. A valve assembly 18 is contained in the body 12, and includes a needle valve 20, a spring-activated pintle 22 and an armature portion 21. The needle valve 20 interferingly seats in the fuel nozzle 28 to control fuel flow therethrough. While the illustrated embodiment depicts a triangularly-shaped needle valve 20, other embodiments may utilize a ball. In one embodiment, the armature portion 21 is fixedly coupled to the pintle 22 and configured to linear translate as a unit with the pintle 22 and the needle valve 20 in first and second directions 81, 82, respectively. In another embodiment, the armature portion 21 may be slidably coupled to the pintle 22. For instance, the armature portion 21 may slide in the first direction 81 until being stopped by a pintle stop fixedly attached to the pintle 22. Likewise, the armature portion 21 may slide in the second direction 82 independent of the pintle 22 until contacting a pintle stop fixedly attached to the pintle 22. Upon contact with the pintle stop fixedly attached to the pintle 22, the force of the armature portion 21 causes the pintle 22 to be urged in the second direction 82 with the armature portion 21. The armature portion 21 may include protuberances to engage with various stops within the fuel injector 10.

An annular electromagnet assembly 24, including an electrical coil and a magnetic core, is configured to magnetically engage the armature portion 21 of the valve assembly 18. The electric coil and magnetic core assembly 24 is depicted for illustration purposes to be outside of the body of the fuel injector 10; however, embodiments herein are directed toward the electric coil and magnetic core assembly 24 to be either integral to, or integrated within, the fuel injector 10. The electric coil is wound onto the magnetic core, and includes terminals for receiving electrical current from the injector driver 50. Hereinafter, the "electrical coil and magnetic core assembly" will simply be referred to as an "electrical coil 24". When the electrical coil 24 is deactivated and de-energized, the spring 26 urges the valve assembly 18 including the needle valve 20 toward the fuel nozzle 28 in the first direction 81 to close the needle valve 20 and prevent fuel flow therethrough. When the electrical coil 24 is activated and energized, electromagnetic force acts on the armature portion 21 to overcome the spring force exerted by the spring 26 and urges the valve assembly 18 in the second direction 82, moving the needle valve 20 away from the fuel nozzle 28 and permitting flow of pressurized fuel within the valve assembly 18 to flow through the fuel nozzle 28. The fuel injector 10 may include a stopper 29 that interacts with the valve assembly 18 to stop translation of the valve assembly 18 when it is urged to open. In one embodiment, a pressure sensor 32 is configured to obtain fuel pressure 34 in the high-pressure fuel line 30 proximal to the fuel injector 10, preferably upstream of the fuel injector 10. In another embodiment, a pressure sensor may be integrated within the inlet 15 of the fuel injector in lieu of the pressure sensor 32 in the fuel rail 30 or in combination with the pressure sensor. The fuel injector 10 in the illustrated embodiment of FIG. 1 is not limited to the spatial and geometric arrangement of the features described herein, and may include additional features and/or other spatial and geometric arrangements known in the art for operating the fuel injector 10 between open and closed positions for controlling the delivery of fuel to the engine 100.

The control module 60 generates an injector command signal 52 that controls the injector driver 50, which activates the fuel injector 10 to the open position for affecting a fuel injection event. In the illustrated embodiment, the control module 60 communicates with one or more external control modules such as an engine control module (ECM) 5; however, the control module 60 may be integral to the ECM in other embodiments. The injector command signal 52 correlates to a desired mass of fuel to be delivered by the fuel injector 10 during the fuel injection event. Similarly, the injector command signal 52 may correlate to a desired fuel flow rate to be delivered by the fuel injector 10 during the fuel injection event. As used herein, the term "desired injected fuel mass" refers to the desired mass of fuel to be delivered to the engine by the fuel injector 10. As used herein, the term "desired fuel flow rate" refers to the rate at which fuel is to be delivered to the engine by the fuel injector 10 for achieving the desired mass of fuel. The desired injected fuel mass can be based upon one or more monitored input parameters 51 input to the control module 60 or ECM 5. The one or more monitored input parameters 51 may include, but are not limited to, an operator torque request, manifold absolute pressure (MAP), engine speed, engine temperature, fuel temperature, and ambient temperature obtained by known methods. The injector driver 50 generates an injector activation signal 75 in response to the injector command signal 52 to activate the fuel injector 10. The injector activation signal 75 controls current flow to the electrical coil 24 to generate electromagnetic force in response to the injector command signal 52. An electric power source 40 provides a source of DC electric power for the injector driver 50. In some embodiments, the DC electric power source provides low voltage, e.g., 12 V, and a boost converter may be utilized to output a high voltage, e.g., 24V to 200 V, that is supplied to the injector driver 50. When activated using the injector activation signal 75, the electromagnetic force generated by the electrical coil 24 urges the armature portion 21 in the second direction 82. When the armature portion 21 is urged in the second direction 82, the valve assembly 18 in consequently caused to urge or translate in the second direction 82 to an open position, allowing pressurized fuel to flow therethrough. The injector driver 50 controls the injector activation signal 75 to the electrical coil 24 by any suitable method, including, e.g., pulsewidth-modulate (PWM) electric power flow. The injector driver 50 is configured to control activation of the fuel injector 10 by generating suitable injector activation signals 75. In embodiments that employ a plurality of successive fuel injection events for a given engine cycle, an injector activation signal 75, that is fixed for each of the fuel injection events within the engine cycle, may be generated.

The injector activation signal 75 is characterized by an injection duration and a current waveform that includes an initial peak pull-in current and a secondary hold current. The initial peak pull-in current is characterized by a steady-state ramp up to achieve a peak current, which may be selected as described herein. The initial peak pull-in current generates electromagnetic force in the electrical coil 24 that acts on the armature portion 21 of the valve assembly 18 to overcome the spring force and urge the valve assembly 18 in the second direction 82 to the open position, initiating flow of pressurized fuel through the fuel nozzle 28. When the initial peak pull-in current is achieved, the injector driver 50 reduces the current in the electrical coil 24 to the secondary hold current. The secondary hold current is characterized by a somewhat steady-state current that is less than the initial peak pull-in current. The secondary hold current is a current level controlled by the injector driver 50 to maintain the valve assembly 18 in the open position to continue the flow of pressurized fuel through the fuel nozzle 28. The secondary hold current is preferably indicated by a minimum current level. In some embodiments, the injector driver 50 is configured as a bi-directional current driver capable of providing a negative current flow for drawing current from the electrical coil 24. As used herein, the term "negative current flow" refers to the direction of the current flow for energizing the electrical coil to be reversed. Accordingly, the terms "negative current flow" and "reverse current flow" are used interchangeably herein. In embodiments when the injector driver 50 is configured as the bi-directional current driver, the injector activation signal 75 may be additionally characterized by the negative current flow for drawing current from the electrical coil 24.

Embodiments herein are directed toward controlling the fuel injector for a plurality of fuel injection events that are closely-spaced during an engine cycle. As used herein, the term "closely-spaced" refers to a dwell time between each consecutive fuel injection event being less than a predetermined dwell time threshold. As used herein, the term "dwell time" refers to a period of time between an end of injection for the first fuel injection event (actuator event) and a start of injection for a corresponding second fuel injection event (actuator event) of each consecutive pair of fuel injection events. The dwell time threshold can be selected to define a period of time such that dwell times less than the dwell time threshold are indicative of producing instability and/or deviations in the magnitude of injected fuel mass delivered for each of the fuel injection events. The instability and/or deviations in the magnitude of injected fuel mass may be responsive to a presence of secondary magnetic impacts. The secondary magnetic impacts include persistent eddy currents and magnetic hysteresis within the fuel injector and a residual flux based thereon. The persistent eddy currents and magnetic hysteresis are present due to transitions in initial flux values between the closely-spaced fuel injection events. Accordingly, the dwell time threshold is not defined by any fixed value, and selection thereof may be based upon, but not limited to, fuel temperature, fuel injector temperature, fuel injector type, fuel pressure and fuel properties such as fuel types and fuel blends. As used herein, the term "flux" refers to magnetic flux indicating the total magnetic field generated by the electrical coil 24 and passing through the armature portion. Since the turns of the electrical coil 24 link the magnetic flux in the magnetic core, this flux can therefore be equated from the flux linkage. The flux linkage is based upon the flux density passing through the armature portion, the surface area of the armature portion adjacent to the air gap and the number of turns of the coil 24. Accordingly, the terms "flux", "magnetic flux" and "flux linkage" will be used interchangeably herein unless otherwise stated.

For fuel injection events that are not closely spaced, a fixed current waveform independent of dwell time may be utilized for each fuel injection event because the first fuel injection event of a consecutive pair has little influence on the delivered injected fuel mass of the second fuel injection event of the consecutive pair. However, the first fuel injection event may be prone to influence the delivered injected fuel mass of the second fuel injection event, and/or further subsequent fuel injection events, when the first and second fuel injection events are closely-spaced and a fixed current wave form is utilized. Any time a fuel injection event is influenced by one or more preceding fuel injection events of an engine cycle, the respective delivered injected fuel mass of the corresponding fuel injection event can result in an unacceptable repeatability over the course of a plurality of engine cycles and the consecutive fuel injection events are considered closely-spaced. More generally, any consecutive actuator events wherein residual flux from the preceding actuator event affects performance of the subsequent actuator event relative to a standard, for example relative to performance in the absence of residual flux, are considered closely-spaced.

Exemplary embodiments are further directed toward providing feedback signal(s) 42 from the fuel injector 10 to the activation controller 80. Discussed in greater detail below, sensor devices may be integrated within the fuel injector 10 for measuring various fuel injector parameters for obtaining the flux linkage of the electrical coil 24, voltage of the electrical coil 24, current through the electrical coil 24 and resistance of the electrical coil 24. A current sensor may be provided on a current flow path between the activation controller 80 and the fuel injector to measure the current provided to the electrical coil 24, or the current sensor can be integrated within the fuel injector 10 on the current flow path. The fuel injector parameters provided via feedback signal(s) 42 may include the flux linkage, voltage and current directly measured by corresponding sensor devices integrated within the fuel injector 10. Resistance can be estimated based on combinations of the flux linkage, voltage and current. Additionally or alternatively, the fuel injector parameters may include proxies provided via feedback signal(s) 42 to—and used by—the control module 60 to estimate the flux linkage, magnetic flux, the voltage, the current and the resistance within the fuel injector 10. The resistance of the electrical coil can be useful for determining an operating temperature of the fuel injector 10. Having feedback of the flux linkage of the electrical coil 24, the voltage of the electrical coil 24, current provided to the electrical coil 24, and resistance of the electrical coil 24, the control module 60 may advantageously modify the activation signal 75 to the fuel injector 10 for multiple consecutive injection events. It will be understood that conventional fuel injectors controlled by open loop operation, are based solely upon a desired current waveform obtained from look-up tables, without any information related to the force producing component of the flux linkage (e.g., magnetic flux) affecting movement of the armature portion 21 and the operating temperature of the fuel injector 10. As a result, conventional feed-forward fuel injectors that only account for current flow for controlling the fuel injector, are prone to instability in consecutive fuel injection events that are closely-spaced.

Embodiments herein are based upon the awareness that it is difficult to estimate the resistance of the electrical coil 24. Generally, the electrical current is only applied to the electrical coil 24 to execute fuel injection events. It is appreciated that the main coil voltage, $V_{MC}$, includes a simple voltage drop component (R×i) and a rate of change of flux-linkage component $$\left(\frac{d\lambda}{dt}\right)$$

as shown in EQ [1] below:

$$V_{MC} = (R \times i) + \frac{d\lambda}{dt} \qquad [1]$$

wherein
$V_{MC}$ is the electrical coil voltage,
λ is the flux-linkage,
R is the resistance of the electrical coil,
i is the measured current through the electrical coil, and
t is time.

When current is changing through the coil, so too is the flux, thus always resulting in a rate of change of flux-linkage component $$\left(\frac{d\lambda}{dt}\right).$$

The main coil inherently exhibits both resistance and inductance. Therefore, even where an applied voltage across the main coil has reached a steady state, the current through the main coil will only reach steady state after a time period corresponding to the time constant of the R/L equivalent, thus resulting in a rate of change of flux-linkage component $$\left(\frac{d\lambda}{dt}\right)$$

until the current through the coil reaches steady state. Since transitions in the electrical current applied to the electrical coil 24 are inevitable during a fuel injection event as evidenced by a current waveform characterizing the fuel injection event, main coil resistance is not readily determinable.

In accordance with the present disclosure, embodiments herein are directed toward providing a probing voltage pulse prior to a fuel injection event for generating a resulting steady-state current flow through the electrical coil 24. The magnitude or amplitude of the voltage pulse applied is sufficiently small and selected to limit the resulting electrical current to not exceed a predetermined threshold. As used herein, the term "predetermined threshold" indicates a magnitude of current through the electrical coil 24 that would generate a magnitude of electromagnetic force sufficient to cause undesirable movement of the armature portion 21. The duration of the voltage pulse applied must be sufficient for generating the resulting electrical current to achieve steady-state. When the electrical current is at steady state, the voltage across the main coil is therefore represented simply by a resistive drop component in accordance with the following relationship which is the same relationship as EQ. [1] assuming a zero rate of change in of flux-linkage:

$$V_{MC} = (R \times i) \qquad [2]$$

Accordingly, using the amplitude of the probing voltage pulse and the resulting steady-state electrical current at the electrical coil 24, the control module 60 of the activation controller 80 may estimate the resistance within the electrical coil 24. The resistance of the electrical coil 24 can be used to obtain the operating temperature within the fuel injector 10 using known correlations.

Obtaining the resistance within the electrical coil 24 therefore is accomplished in accordance with the following relationship:

$$R = \frac{V_{EC}}{i} \qquad [3]$$

wherein $V_{EC}$ is the voltage pulse applied to the electrical coil 24,
i is a measured current through the electrical coil 24, and
R is the resistance of the electrical coil 24.

The voltage and current parameters utilized by EQ. [3] are obtainable by one or more of the aforementioned sensing devices and provided via the feedback signal(s) 42 to the control module 60 of the activation controller 80 for estimating the resistance of the electrical coil 24. The control module 60 may be able to retrieve test data stored within an internal or external memory device that correlates a test resistance to a known temperature. Based on the resistance of the electrical coil 24 obtained utilizing EQ. [3], the test resistance and the known temperature, the operating temperature of the fuel injector 10 can be expressed in accordance with the following relationship $$R(T) = R_0[(1+\alpha(T-T_0)] \qquad [4]$$

wherein $R_0$ is a predetermined resistance of the electrical coil at a predetermined temperature $T_0$,
$T_0$ is the predetermined temperature,
T is the operating temperature of the fuel injector, and
α is a temperature coefficient of the electrical coil.

In a non-limiting example, the temperature coefficient is the temperature coefficient of resistance of copper.

Figure 2:
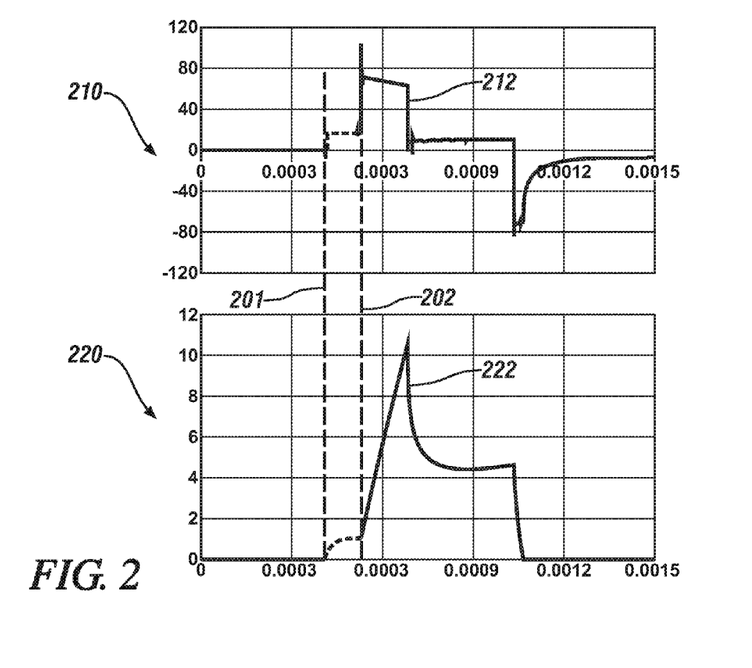
FIG. 2 illustrates non-limiting exemplary plots representing voltage and electrical current profiles when a probing voltage pulse is applied prior to a fuel injection event, in accordance with the present disclosure.

FIG. 2 illustrates non-limiting exemplary plots representing voltage and electrical current profiles when a probing voltage pulse is applied prior to a fuel injection event. Plot 210 illustrates the voltage profile 212 indicating a measured voltage induced by an electrical coil of a fuel injector. The electrical coil and the fuel injector can correspond to the electrical coil 24 and the fuel injector 1 of FIG. 1. The vertical y-axis of plot 210 denotes voltage in Volts (V). Plot 220 illustrates the electrical current profile 222 indicating a measured current through the electrical coil of the fuel injector. The electrical current profile 222 is responsive to the voltage profile 212 of plot 210. The vertical y-axis of plot 220 denotes current in Amperes (A). It will be understood that electrical current energizes the electrical coil to generate an electromagnetic force for opening the fuel injector to deliver an injected fuel mass. Moreover, the electrical current must exceed the predetermined threshold for the fuel injector to open.

The horizontal x-axis in each of plots 210 and 220 represents time in seconds. Dashed vertical line 201 indicates a time at which a probing voltage pulse is applied, wherein the voltage profile 212 increases from zero to magnitude that is maintained until dashed vertical line 202. In response to the probing voltage pulse, the electrical current profile 222 begins to increase until achieving a steady-state value that is maintained until dashed vertical line 202. At dashed vertical line 202, the fuel injection event is initiated and a start of injection occurs once the electrical current includes a magnitude (e.g., greater than the predetermined threshold) sufficient for opening the fuel injector. Thus, the probing voltage pulse applied prior to the fuel injection event during the duration between dashed vertical lines 201 and 202, enables the electrical current through the electrical coil to include a non-zero integer at steady-state such that the resistance of the electrical coil can be estimated and temperature of the fuel injector to ultimately determined. In some embodiments, the probing voltage can include a PWM voltage.

Figure 3:
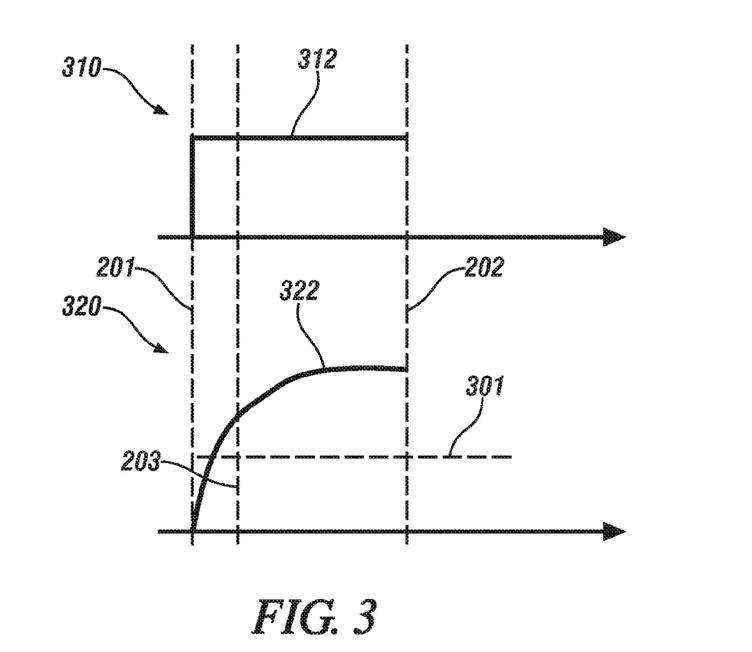
FIG. 3 illustrates non-limiting exemplary plots of voltage and electrical current profiles during a duration when a probing voltage pulse is applied before a fuel injection event, in accordance with the present disclosure.

In one embodiment, a variable boost voltage can be utilized for probing the electrical coil 24 of FIG. 1 so that the magnitude of voltage applied can be selected to limit electrical current through the electrical coil to remain less than the predetermined threshold. FIG. 3 illustrates non-limiting exemplary plots of voltage and electrical current profiles during a duration before a fuel injection event when a probing voltage pulse is applied. Plot 310 illustrates the voltage profile 312 indicating a measured voltage induced by an electrical coil of a fuel injector. The vertical y-axis of plot 310 denotes voltage in Volts (V) and is zero at the origin. Plot 320 illustrates the electrical current profile 322 indicating a measured current through the electrical coil of the fuel injector. The electrical current profile 322 is responsive to the voltage profile 312 of plot 310. The vertical y-axis of plot 320 denotes current in Amperes (A) and is zero at the origin.

The horizontal x-axis in each of plots 310 and 320 denotes time in seconds. Plots 310 and 320 can be described with reference to corresponding plots 210 and 220 of FIG. 2 during the duration between dashed vertical lines 201 and 202. Accordingly, the period of time between dashed vertical lines 201 and 202 indicates the desired duration for the probing voltage pulse to be applied such that the electrical current achieves the steady-state value prior to dashed vertical line 202. Moreover, the magnitude or amplitude of the probing voltage pulse limits the electrical current from exceeding the predetermined threshold at which the fuel injector would be caused to open due to a generated electromagnetic force overcoming a spring preload force that biases an armature to close the fuel injector.

At dashed vertical line 202, the electrical current profile 320 indicates the measured current through the electrical coil is now a non-zero integer and is at steady state. Accordingly, the control module 60 of FIG. 1 can calculate the resistance of the electrical coil 24 using EQ. [3], wherein the measured electrical current and the measured voltage at the electrical coil 24 are obtained at dashed vertical line 202 when the measured electrical current (and voltage pulse) is at steady state. Thereafter, the operating temperature of the fuel injector 10 can be obtained using EQ. [4] based on the resistance calculated from EQ. [3].

In another embodiment, the variable boost voltage utilized for probing the electrical coil 24 of FIG. 1 can enable inductance of the electrical coil 24 to be estimated. Referring to the non-limiting exemplary plots 310 and 320 of FIG. 3, the electrical current is desirably sampled at a reasonably high sampling rate (e.g., every 10 microseconds) once the probing voltage pulse is applied at dashed vertical line 201. For example, the control module 60 of FIG. 1 may sample the electrical current provided via feedback signal(s) 42 at the reasonably high sampling rate. Once the electrical current profile 322 indicates that the measured electrical current achieves a predetermined percentage at dashed horizontal line 301 of the final steady-state value of electrical current at dashed vertical line 202, a time constant can be determined as indicated by dashed vertical line 203. In a non-limiting example, the predetermined percentage is equal to 63.2% of the final steady-state value. Using the measured time constant at dashed vertical line 203 and a resistance of a previous cycle calculated using EQ. [3], the control module 60 of FIG. 1 can calculate the inductance of the electrical coil 24 based on the following relationship.

$$L = R \times T_C \qquad [5]$$

wherein R is an estimated resistance of the electrical coil 24 from a previous cycle,
$T_C$ is the time constant illustrated at dashed vertical line 203 of FIG. 3, and
L is the estimated unsaturated inductance of the electrical coil 24.

Figure 4:
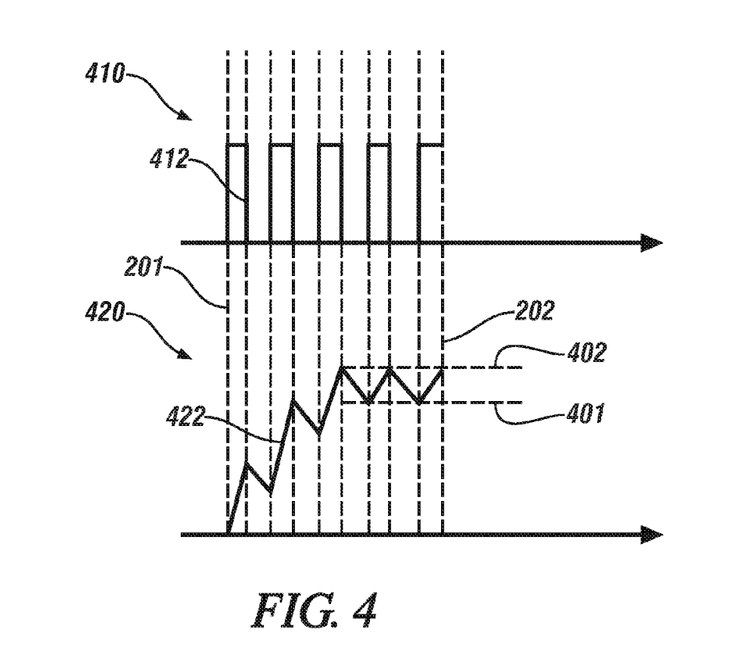
FIG. 4 illustrates non-limiting exemplary plots of voltage and electrical current profiles during a duration when a probing PWM voltage pulse is applied before a fuel injection event, in accordance with the present disclosure.

Instead of using the variable boost voltage, some embodiments can utilize a PWM voltage pulse for probing the electrical coil 24 of FIG. 1 so that the magnitude of voltage applied and corresponding duty cycle of the corresponding PWM signal can be selected to limit the electrical current through the electrical coil to reach a steady-state pulse that is less than the predetermined threshold. FIG. 4 illustrates non-limiting exemplary plots of voltage and electrical current profiles during a duration before a fuel injection event when a probing PWM voltage pulse is applied. Plot 410 illustrates the voltage profile 412 indicating a measured voltage pulse have a prescribed number of duty cycles induced by an electrical coil of a fuel injector and applied via a PWM signal. Specifically, the measured voltage pulsates between ON and OFF. The vertical y-axis of plot 410 denotes voltage in Volts (V) and is zero at the origin. Plot 420 illustrates the electrical current profile 422 indicating a measured current pulse through the electrical coil of the fuel injector. The electrical current profile 422 is responsive to the voltage profile 412 of plot 410. As such, the electrical current pulsates responsively to the ON/OFF duty cycles of the PWM voltage pulse. The vertical y-axis of plot 320 denotes current in Amperes (A) and is zero at the origin.

The horizontal x-axis in each of plots 410 and 420 denotes time in seconds. Plots 410 and 420 can be described with reference to corresponding plots 210 and 220 of FIG. 2 during the duration between dashed vertical lines 201 and 202. Accordingly, the period of time between dashed vertical lines 201 and 202 indicates a desired duration where the duty cycles of the probing PWM voltage pulse is applied such that the electrical current includes a steady-state pulse before dashed vertical line 202. Dashed horizontal lines 401 and 402 indicate minimum and maximum electrical current values, respectively, once the electrical current profile 422 is indicative of the steady-state pulse. An average electrical current can be calculated between the minimum and maximum electrical current values at dashed horizontal lines 401 and 402, respectively. This average electrical current can be utilized in place of the measured electrical current, i, of EQ. [3] for calculating the resistance of the electrical coil 24. Thereafter, the operating temperature of the fuel injector 10 can be obtained using EQ. [4] based on the resistance calculated from EQ. [3].

In another embodiment, the PWM voltage for probing the electrical coil 24 of FIG. 1 can enable an unsaturated incremental inductance of the electrical coil 24 to be estimated. Voltage induced by the electrical coil during voltage probing can be expressed as follows.

$$V_{EC} = R \times i + L\frac{di}{dt} \quad [6]$$

wherein $V_{EC}$ is the PWM voltage pulse applied to the electrical coil 24.

Referring to the non-limiting exemplary plots 410 and 420 of FIG. 4, the electrical current profile 422 indicates the measured electrical current pulse includes a corresponding peak that occurs at the end of the ON period for each PWM duty cycle. Based upon the expression of EQ. [6], the unsaturated incremental inductance of the electrical coil 24 can be calculated by the control module 60 at the end of the ON period for each PWM duty cycle based on the following relationship.

$$L_{inc} = \frac{(V_{EC} - RI)}{(\Delta I / \Delta t)} \quad [7]$$

wherein $L_{inc}$ is the incremental inductance of the electrical coil 24,
 I is the measured current at the end of the ON period for the corresponding PWM duty cycle,
 $\Delta I$ is a change in electrical current during the ON time of the corresponding PWM duty cycle, and
 $\Delta t$ is the time of period for the corresponding PWM duty cycle.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A method for parameter estimation in an electromagnetic actuator comprising an electrical coil and an armature, the method comprising:
 applying a voltage pulse to the electrical coil of the actuator prior to an actuator event, said voltage pulse of sufficient duration to ensure that a resulting electrical current achieves steady state and having an amplitude insufficient to cause armature displacement; and
 estimating at least one parameter of the actuator based upon the voltage pulse and the steady state current.

2. The method of claim 1, wherein said at least one parameter of the actuator comprises electrical coil resistance, and wherein estimating electrical coil resistance is in accordance with the following relationship:

$$R = \frac{V_{EC}}{i}$$

wherein $V_{EC}$ is the voltage pulse,
 i is the steady state current, and
 R is the electrical coil resistance.

3. The method of claim 2, wherein said at least one parameter further comprises actuator temperature, and wherein estimating actuator temperature is in accordance with the following relationship:

$$R(T) = R_0[(1+\alpha(T-T_0)]$$

wherein R is electrical coil resistance,
 T is actuator temperature,
 $R_0$ is a predetermined resistance of the electrical coil at a predetermined temperature $T_0$,
 $T_0$ is the predetermined temperature, and
 $\alpha$ is a temperature coefficient of the electrical coil.

4. The method of claim 2, wherein said at least one parameter further comprises electrical coil inductance, and wherein estimating electrical coil inductance comprises:
 determining a time constant corresponding to said resulting electrical current achieving a predetermined percentage of steady state current; and
 estimating the electrical coil inductance based upon the estimated resistance of the electrical coil and the determined time constant in accordance with the following relationship:

$$L = R \times T_C$$

wherein L is the inductance of the electrical coil,
 R is the estimated resistance of the electrical coil, and
 $T_c$ is the time constant.

5. The method of claim 1, wherein applying the voltage pulse comprises pulse width modulating a voltage at a predetermined magnitude and duty cycle.

6. An electromagnetic actuator system, comprising:
 an electrical coil;
 an armature;
 a control module configured to:
  apply a voltage pulse to the electrical coil of the actuator prior to an actuator event, said voltage pulse of sufficient duration to ensure that a resulting electrical current achieves steady state and having an amplitude insufficient to cause armature displacement; and
  estimate at least one parameter of the actuator based upon the voltage pulse and the steady state current.

7. The electromagnetic actuator system of claim 6, wherein said at least one parameter of the actuator comprises electrical coil resistance, and wherein electrical coil resistance is estimated in accordance with the following relationship:

$$R = \frac{V_{EC}}{i}$$

wherein $V_{EC}$ is the voltage pulse, i is the steady state current, and
R is the electrical coil resistance.

8. The electromagnetic actuator system of claim 7, wherein said at least one parameter further comprises actuator temperature, and wherein actuator temperature is estimated in accordance with the following relationship:

$$R(T)=R_0[(1+\alpha(T-T_0)]$$

wherein R is electrical coil resistance,
T is actuator temperature,
$R_0$ is a predetermined resistance of the electrical coil at a predetermined temperature $T_0$,
$T_0$ is the predetermined temperature, and
$\alpha$ is a temperature coefficient of the electrical coil.

9. The electromagnetic actuator system of claim 7, wherein said at least one parameter further comprises electrical coil inductance, and wherein estimating electrical coil inductance comprises:
determining a time constant corresponding to said resulting electrical current achieving a predetermined percentage of steady state current; and
estimating the electrical coil inductance based upon the estimated resistance of the electrical coil and the determined time constant in accordance with the following relationship:

$$L=R \times T_C$$

wherein L is the inductance of the electrical coil,
R is the estimated resistance of the electrical coil, and
$T_C$ is the time constant.

10. The electromagnetic actuator system of claim 6, wherein applying the voltage pulse comprises pulse width modulating a voltage at a predetermined magnitude and duty cycle.

11. An electromagnetic fuel injection system, comprising:
a fuel injector comprising:
an electrical coil; and
an armature; and
a control module configured to:
apply a voltage pulse to the electrical coil of the fuel injector prior to an actuator event, said voltage pulse of sufficient duration to ensure that a resulting electrical current achieves steady state and having an amplitude insufficient to cause armature displacement; and
estimate at least one parameter of the fuel injector based upon the voltage pulse and the steady state current.

12. The electromagnetic fuel injection system of claim 11, wherein said at least one parameter of the fuel injector comprises electrical coil resistance, and wherein electrical coil resistance is estimated in accordance with the following relationship:

$$R = \frac{V_{EC}}{i}$$

wherein VEC is the voltage pulse,
i is the steady state current, and
R is the electrical coil resistance.

13. The electromagnetic fuel injection system of claim 12, wherein said at least one parameter further comprises fuel injector temperature, and wherein fuel injector temperature is estimated in accordance with the following relationship:

$$R(T)=R_0[(1+\alpha(T-T_0)]$$

wherein R is electrical coil resistance,
T is actuator temperature,
$R_0$ is a predetermined resistance of the electrical coil at a predetermined temperature $T_0$,
$T_0$ is the predetermined temperature, and
$\alpha$ is a temperature coefficient of the electrical coil.

14. The electromagnetic fuel injection system of claim 11, wherein applying the voltage pulse comprises pulse width modulating a voltage at a predetermined magnitude and duty cycle.

* * * * *